United States Patent [19]
Obata

[11] Patent Number: 5,469,071
[45] Date of Patent: Nov. 21, 1995

[54] RESISTOR SENSOR INPUT APPARATUS

[75] Inventor: Yosimori Obata, Tokyo, Japan

[73] Assignee: Kabushiki Kaisha Toshiba, Kawasaki, Japan

[21] Appl. No.: 354,126

[22] Filed: Dec. 6, 1994

[30] Foreign Application Priority Data

Dec. 7, 1993 [JP] Japan .................... 5-306375

[51] Int. Cl.⁶ .................................... G01R 27/14
[52] U.S. Cl. ................ 324/713; 324/691; 324/705
[58] Field of Search .......................... 324/649, 691, 324/693, 705, 710, 712, 713

[56] References Cited

U.S. PATENT DOCUMENTS 4,160,949  7/1979  McFayden ................... 324/705
5,371,469  12/1994  Anderson ................... 324/705

Primary Examiner—Kenneth A. Wieder
Assistant Examiner—Glenn W. Brown
Attorney, Agent, or Firm—Oblon, Spivak, McClelland, Maier, & Neustadt

[57] ABSTRACT

Disclosed is an apparatus for detecting a resistance value of a resistor sensor through three signal lines with high detection accuracy. In the apparatus, a reference resistance element is inserted in a current path of a reference current, first and second voltages across the ground and first and second signal lines are respectively held in first and second holding portions and a third voltage across the terminals of a reference resistance element is held in a third holding portion. The first and second voltages held in the first and second holding portions are output simultaneously and the third voltage held in the third holding portion is output at a timing different from the timing when the first and second voltages are output. A differential amplifier detects the third voltage and a differential voltage.

17 Claims, 5 Drawing Sheets

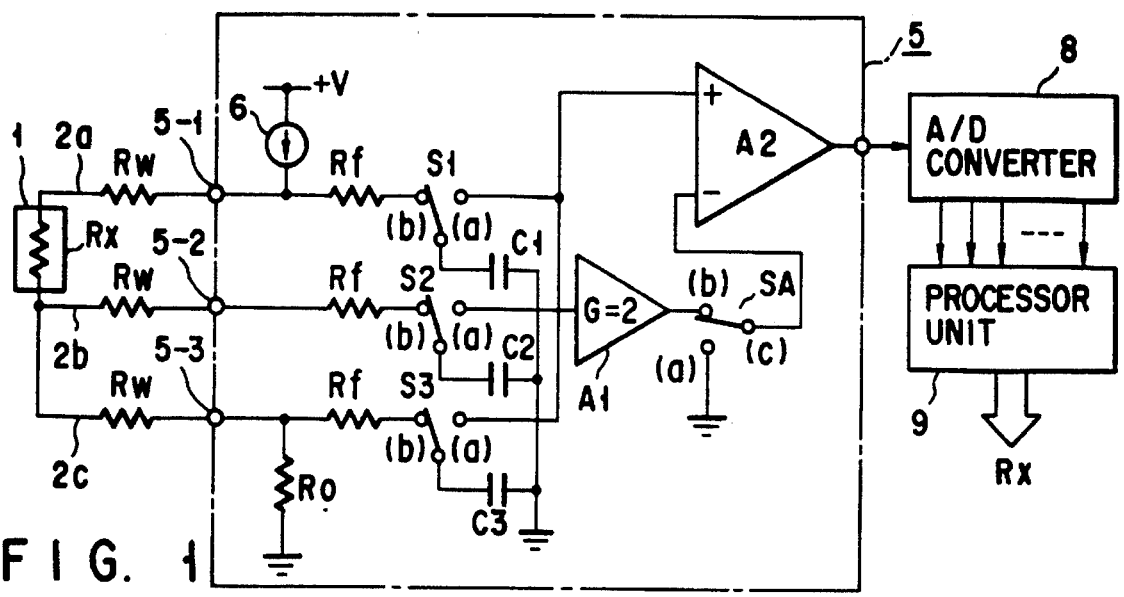
F I G. 1
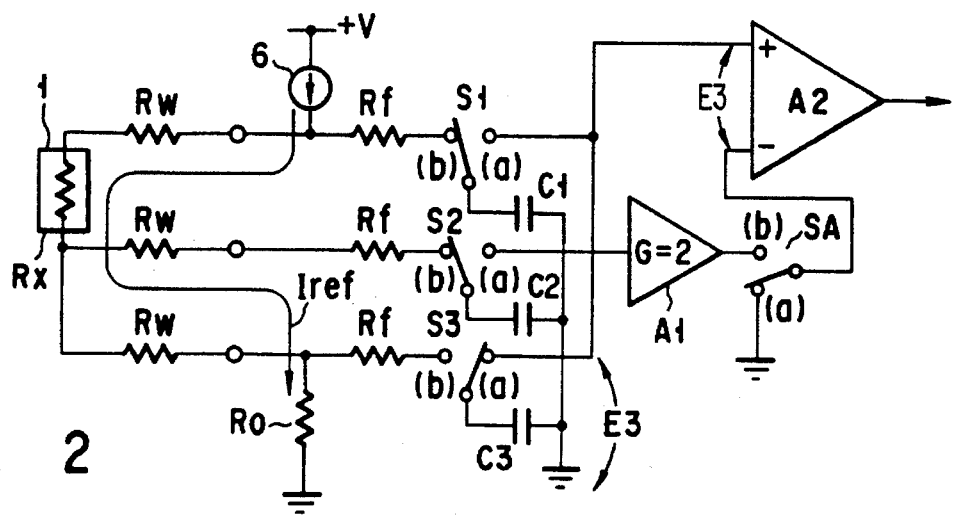
F I G. 2
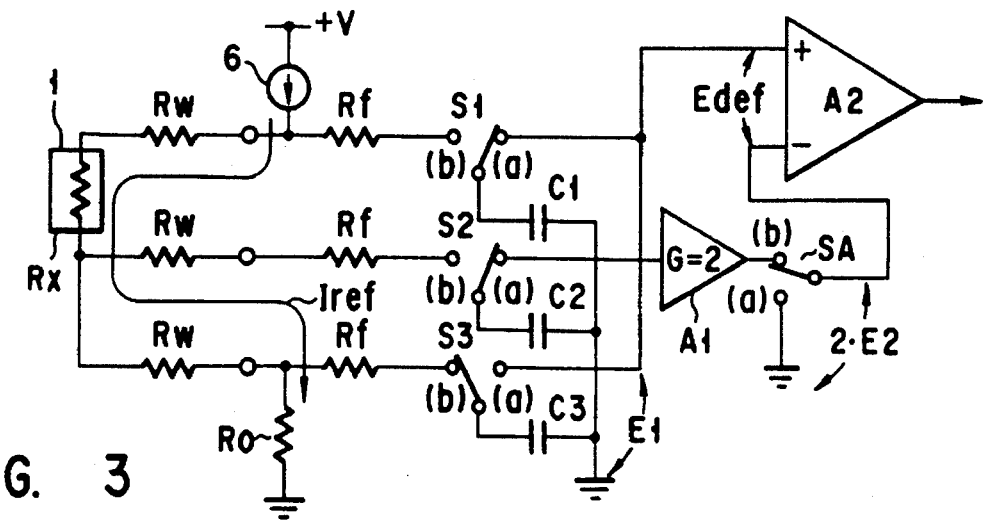
F I G. 3

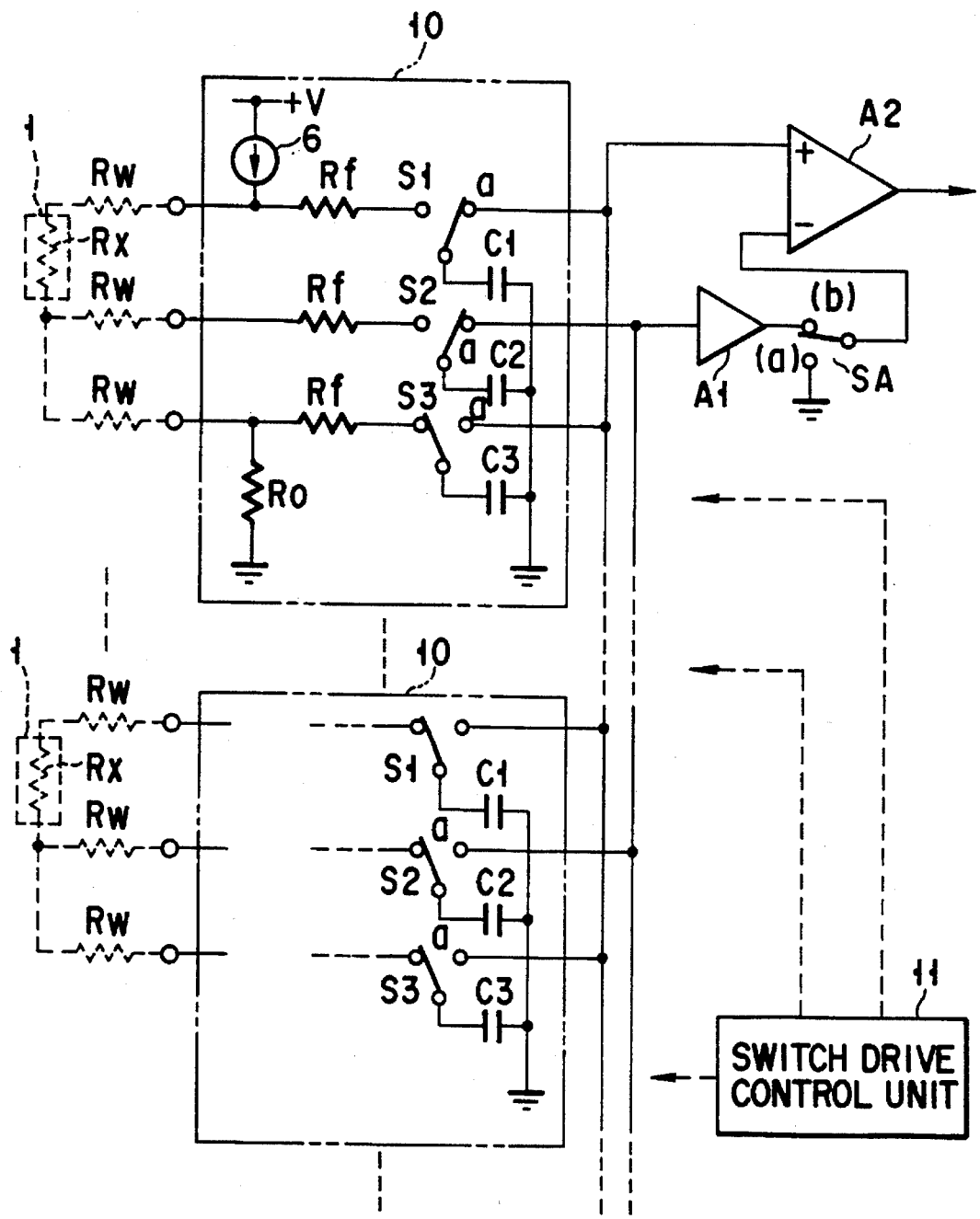
F I G. 6

RESISTOR SENSOR INPUT APPARATUS

BACKGROUND OF THE INVENTION

1. Field of the Invention

The present invention relates to a resistor sensor input apparatus, connected to a resistor sensor via a signal line, detecting a resistance value in the resistor sensor by causing a current to flow through the resistor sensor via the signal line and transmitting the resistance value to a controlling apparatus or a monitoring apparatus.

2. Description of the Related Art

In an automatic controlling apparatus or the like, a resistor sensor is mostly used as a temperature detecting element for detecting various temperatures. The resistor can detect a temperature owing to its characteristic that the resistance value varies in accordance with the temperature. In general, a resistor sensor input apparatus having a reference current source is used to detect a resistance value of the resistor sensor.

A general resistor sensor input apparatus supplies a reference current to a resistor sensor, detects a voltage generated in the resistor sensor, amplifies the detected voltage to an analog voltage of a required level and finally converts the amplified analog voltage to a digital voltage.

FIG. 8 is a schematic diagram showing the general resistor sensor input apparatus.

Three signal lines $2a$, $2b$ and $2c$ are connected to a resistor sensor 1 having a resistance $R_x$. The signal line $2a$ is connected to a positive input terminal of a differential amplifier A2 in a resistor sensor input apparatus 3. The signal line $2b$ is connected through a reference resistance $R_0$ to a negative input terminal of the differential amplifier A2 in the resistor sensor input apparatus 3. The signal line $2c$ is grounded in the resistor sensor input apparatus 3.

A constant current $I_{ref1}$ supplied from a constant current circuit $4a$ flows to the ground via a line resistance $R_w$ of the signal line $2a$, the resistance $R_x$ of the resistor sensor 1 and a line resistance $R_w$ of the signal line $2c$. A constant current $I_{ref2}$ supplied from another constant current circuit $4b$ flows to the ground via a line resistance $R_w$ of the signal line $2b$ and the line resistance $R_w$ of the signal line $2c$.

Voltages $(R_w+R_x+R_w) \cdot I_{ref1}$ and $(R_0+R_w+R_w) \cdot I_{ref2}$ are respectively applied to the positive and negative terminals of the differential amplifier A2. Accordingly, an output voltage $E_d$ from the differential amplifier A2 is obtained by the following equation:

$$E_d = (2R_w+R_x) \cdot I_{ref1} - (2R_w+R_0) \cdot I_{ref2}.$$

If the constant currents $I_{ref1}$ and $I_{ref2}$ are equal to each other, the following output voltage $E_d$ will be obtained:

$$E_d = (R_x-R_0) \cdot I_{ref1}$$

Since the value of the reference resistance $R_0$ is known, the value of the resistance $R_x$ of the resistor sensor 1 is not influenced by the line resistances $R_w$ of the signal lines $2a$ to $2c$ connecting the resistor sensor input apparatus 3 and the resistor sensor 1, as represented by the following equation (1):

$$R_x = (E_d/I_{ref1})+R_0 \qquad (1)$$

FIG. 9 shows an another type of resistor sensor input apparatus, which can be connected to a number of resistor sensors 1. The resistor sensor input apparatus of this type has constant current circuits $4a$ and $4b$ and a reference resistance $R_0$ for each of the resistor sensors 1.

Even if a monitoring apparatus or a control apparatus connected to the resistor sensor input apparatus receive a plurality of resistance values $R_x$ of the resistor sensors 1, it cannot process the values simultaneously. Therefore, the resistances $R_x$ of the resistor sensors 1 are successively read in a time-divisional manner. For this reason, a pair of cooperating switches S are interposed between a differential amplifier A2 and the signal lines $2a$ and $2b$ of each resistor sensor 1, so that only one differential amplifier A2 suffices. A capacitor C is connected between common terminals of the pair of the switches S.

Normally, the switches S are turned to the sides of the signal lines $2a$ and $2b$, so that a voltage across the signal lines $2a$ and $2b$ is held in the capacitor C. The switches S in the respective resistor sensors 1 are successively turned to the side of the differential amplifier A2 for a very short period of time, so that the line voltage held in the capacitor C can be applied to the differential amplifier A2.

However, the resistor sensor input apparatuses shown in FIGS. 8 and 9 have the following drawbacks to be overcome.

First, in the resistor sensor input apparatus shown in FIG. 8, it is necessary that the constant currents $I_{ref1}$ and $I_{ref2}$, output from the constant current circuits $4a$ and $4b$, precisely coincide with each other, in order to detect the resistance $R_x$ with high accuracy. Actually, however, even if the constant current circuits $4a$ and $4b$ have the same specification, they cannot be precisely the same, due to the difference in accuracy of the elements of the circuits $4a$ and $4b$. A relative error and an absolute error in the constant currents $I_{ref1}$ and $I_{ref2}$ directly result in an error in the detection accuracy of the resistance $R_x$.

Secondly, a constant current circuit which outputs a precisely constant current is expensive. If two expensive constant current circuits $4a$ and $4b$ are incorporated in a resistor sensor input apparatus, the manufacturing cost will be considerably increased.

Even if expensive constant current circuits $4a$ and $4b$ are employed, when they are actually incorporated in an apparatus, the values of the constant currents $I_{ref1}$ and $I_{ref2}$ of the circuits $4a$ and $4b$ must be adjusted in advance so as to coincide with each other. In addition, since it is necessary to precisely set the values of the constant currents $I_{ref1}$ and $I_{ref2}$ as indicated by the equation (1), the values must be re-adjusted periodically so as to coincide with the set value.

In the case of the resistor sensor input apparatus, as shown in FIG. 9, for detecting the values of the resistances $R_x$ of the plurality of resistor sensors 1, since two constant current circuits $4a$ and $4b$ are required in each of the resistor sensors 1, the input apparatus suffers from substantially the same problem as in the case of detecting the value of the resistance $R_x$ of one resistor sensor 1 as shown in FIG. 8.

SUMMARY OF THE INVENTION

An object of the present invention is to provide a simple and operable resistor sensor input apparatus, in which the number of reference current sources for one resistor sensor is reduced as compared to the conventional art and the value of a reference current flowing through a resistor sensor need not be detected.

The present invention is applied to an apparatus having a first signal line connected to one end of a resistor sensor, a second signal line connected to the other end of the resistor sensor and a third signal line connected to the ground, wherein a reference current is supplied from a reference current source to the resistor sensor through the first signal line, so that a resistance value of the resistor sensor is detected by measuring a voltage across terminals of the resistor sensor through the first and second signal lines.

According to an aspect of the present invention, a reference resistor is inserted in a current path of the reference current. First and second voltages across the ground and the first and second signal lines are respectively held by first and second voltage holding elements. A third voltage across terminals of the reference resistor is held by a third voltage holding element. By means of a switch circuit, the first and second voltages held by the first and second voltage holding elements are simultaneously output at a timing and the third voltage held by the third voltage holding element is output at a timing different from the timing at which the first and second voltages are output. A differential amplifier detects the third voltage and a differential voltage between the first voltage and a voltage twice the second voltage.

A resistor sensor input apparatus according to another aspect of the present invention further comprises a reference voltage source for outputting a reference voltage and a calibration switch circuit for applying the reference voltage output from the reference voltage source to input terminals of the differential amplifier and short-circuiting the input terminals of the differential amplifier.

A resistor sensor input apparatus according to still another aspect of the present invention detects resistance values of a plurality of resistor sensors in a time-divisional manner. One end of each of the resistor sensors is connected to a first signal line and the other end thereof is connected to a second signal line and a third line which is grounded. A reference current output from a reference current source is supplied to the first signal line and a voltage across the terminals of the resistor sensor is measured via the first and second signal lines, thereby detecting a resistance value of the resistor sensor.

The resistor sensor input apparatus comprises a plurality of first and second voltage holding elements for holding voltages across the ground and the first and second signal lines connected to the resistor sensors; a plurality of third voltage holding elements for holding voltages across the terminals of the respective reference resistors inserted in paths of reference currents supplied to the resistor sensors; a time-divisional extracting circuit for extracting first to third voltages held in first to third voltage holding elements in different periods of time for the respective resistor sensors; and a differential amplifier for detecting the third voltages of the respective resistor sensors successively extracted by the time-divisional extracting circuit and detecting a differential voltage between the first voltage and a voltage twice the second voltage.

In the above resistor sensor input apparatus, a reference resistance element ($R_0$) is inserted in a current supplying path for supplying a reference current $I_{ref}$ to the each of resistance sensor ($R_x$). A voltage across the terminals of the reference resistance element is independently detected from the differential amplifier as the third voltage $E_3$ (=$R_o \cdot I_{ref}$) by means of a switch circuit.

The differential amplifier detects a differential voltage $E_{def}$ (=$E_1-2 \cdot E_2$) between the first voltage $E_1$ on the side of the first signal line connected to the resistor sensor ($R_x$) and the voltage twice the second voltage $E_2$ (2·$E_2$).

The first voltage $E_1$ is equal to the product of the reference current $I_{ref}$ and the sum of the resistances of the first and third signal lines and the resistances ($R_w+R_0+R_w$). The second voltage $E_2$ is equal to the product of the reference current $I_{ref}$ and the sum of the resistances of the third signal line and the resistances ($R_w+R_0$).

When the above products are substituted for $E_1$ and $E_2$ of the equation for obtaining the differential voltage ($E_{def}=E_1-2 \cdot E_2$), the resistances ($R_w$) of the signal lines are eliminated. Further when the reference current $I_{ref}$ (=$E_3/R_0$) is substituted for $I_{ref}$ of the equation for obtaining the differential voltage $E_{def}$, the resistances $R_x$ of the resistor sensor can be expressed by the reference resistance element $R_0$ and the detected voltages $E_3$ and $E_{def}$.

Thus, the value of the resistance $R_x$ can be detected, using one reference current source for every resistor sensor, without directly measuring the reference current.

According to still another aspect of the present invention, a reference voltage output from a reference voltage source is applied to a differential amplifier in a correcting operation prior to an actual resistance measuring operation and the input terminals of the differential amplifier are short-circuited, so that the gain and the zero point of the differential amplifier can be adjusted.

According to further aspect of the present invention, a resistor sensor input apparatus detects the values of a plurality of resistances $R_x$ in a time divisional manner. In this case also, a differential amplifier detects the aforementioned voltages $E_{def}$ and $E_3$ of every resistor sensor. Only one differential amplifier suffices for all the resistor sensors. Voltages $E_1$ to $E_3$ of the resistor sensors are applied to the differential amplifier in a time-divisional manner in different time periods for the respective resistor sensors.

BRIEF DESCRIPTION OF THE DRAWINGS

FIG. 1 is a circuit diagram showing a resistor sensor input apparatus according to a first embodiment of the present invention;

FIG. 2 is a diagram showing a state of the switches of the apparatus of the first embodiment;

FIG. 3 is a diagram showing another state of the switches of the apparatus of the first embodiment;

FIG. 6 is a circuit diagram showing a resistor sensor input apparatus according to a third embodiment of the present invention;

DETAILED DESCRIPTION OF THE PREFERRED EMBODIMENTS

Embodiments of the present invention will be described with reference to the accompanying drawings.

Figure 8:
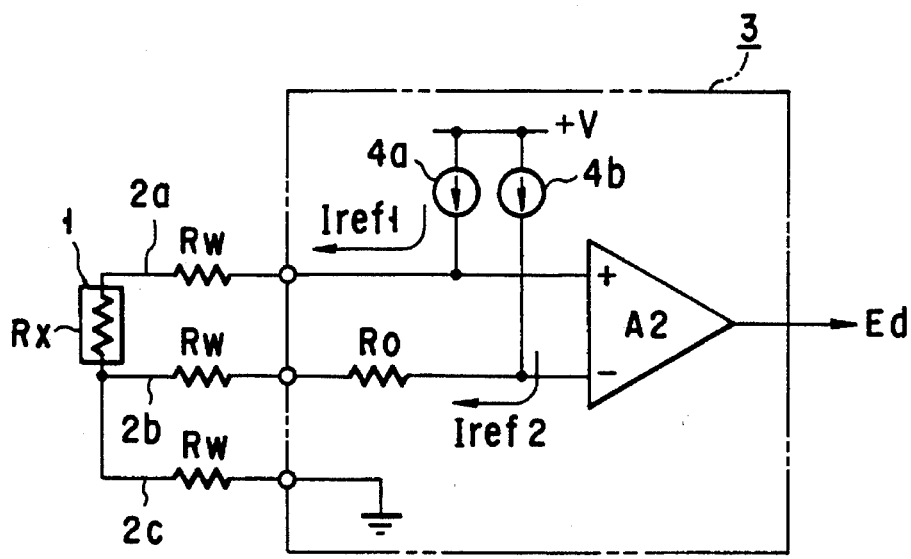
FIG. 8 is a circuit diagram showing a conventional resistor sensor input apparatus.
Figure 9:
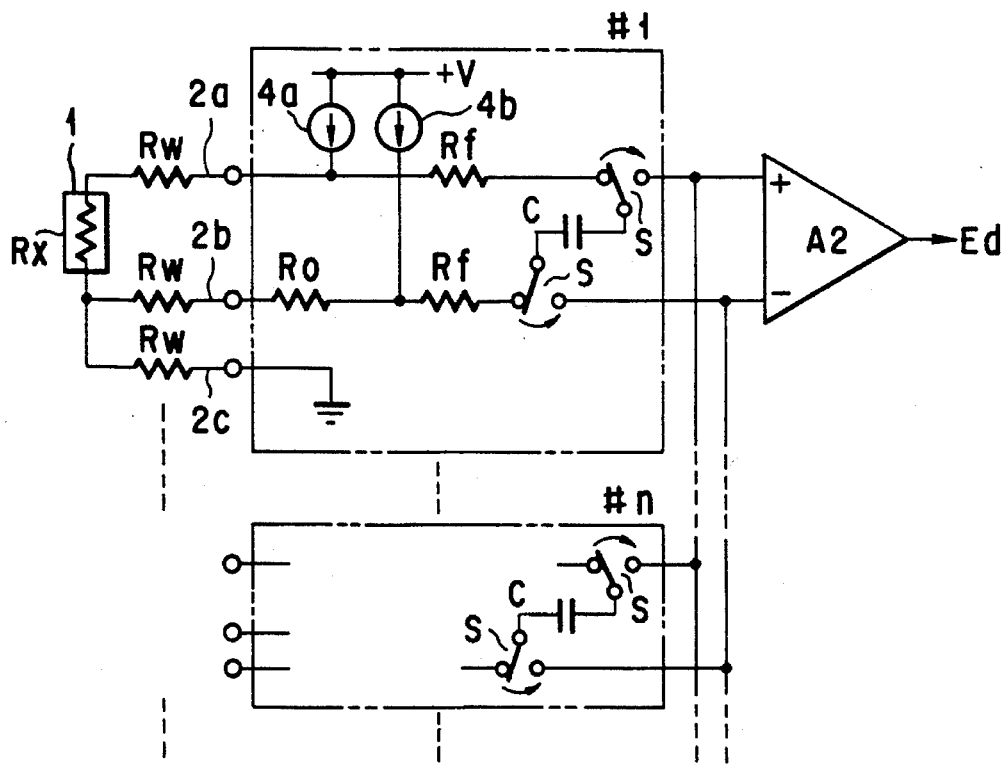
FIG. 9 is a circuit diagram showing another conventional resistor sensor input apparatus.

FIG. 1 is a circuit diagram showing a resistor sensor input apparatus according to a first embodiment of the present invention. In FIG. 1, the elements having the same functions as in the resistor sensor input apparatus shown in FIG. 8 are identified with the same reference numerals used in FIG. 8.

Three signal lines 2a, 2b and 2c are connected to a resistor sensor 1 having a resistance $R_x$. More specifically, a first end of the signal line 2a is connected to one end of the resistor sensor 1 and first ends of the signal lines 2b and 2c are connected to the other end of the resistor sensor 1. The first to third signal lines 2a to 2c are respectively connected to first to third contact terminals 5-1 to 5-3 provided in the resistor sensor input apparatus 5. The first to third signal lines 2a to 2c constitute a coaxial cable between the resistor sensor 1 and the resistor sensor input apparatus 5. Hence, these signal lines 2a to 2c have resistances $R_w$ of the same length and the same value.

The first contact terminal 5-1, connected to the first signal line 2a, is connected to a positive input terminal of a differential amplifier A2 via terminals (b) and (a) of a switch S1 in the resistor sensor input apparatus 5. The first signal line 2a (the first contact terminal 5-1) is connected to a reference current source 6 in the resistor sensor input apparatus 5. The reference current source 6 outputs a reference current $I_{ref}$.

The second contact terminal 5-2, connected to the second signal line 2b, is connected to an input terminal of an amplifier A1 via terminals (b) and (a) of a switch S2 in the resistor sensor input apparatus 5. The amplifier A1, having a gain (G=2), amplifies and outputs a second voltage $E_2$ applied to the input terminal to double (2·$E_2$). Am output terminal of the amplifier A1 is connected to a negative input terminal of the differential amplifier A2 via a switch SA. A terminal (a) of the switch SA is grounded.

The third contact terminal 5-3, connected to the third signal line 2c, is grounded via a reference resistance $R_0$ in the resistor sensor input apparatus 5. The signal line 2c is connected to the positive input terminal of the differential amplifier A2 via terminals (b) and (a) of a switch S3.

Capacitors C1, C2 and C3, serving as first, second and third voltage holding elements, are inserted between the ground and common terminals of the switches S1, S2 and S3 constituting a switch circuit. The switches S1 to S3 and SA are controlled by a switch drive control circuit (not shown) in accordance with the timing chart shown in FIG. 4.

Filter resistances $R_f$ are inserted in the lines in the resistor sensor input apparatus 5. The values of the filter resistances $R_f$ are much smaller than the values of the line resistances $R_w$ of the signal lines 2a to 2c.

An output terminal of the differential amplifier A2 is connected to an A/D converter 8, an output terminal of which is connected to a processor unit 9.

An operation of the resistor sensor input apparatus 5 having the above structure will be described with reference to the timing chart shown in FIG. 4.

First, the switches S1 to S3 and SA are turned to the terminal (b) side as shown in FIG. 1. Thereafter, the apparatus is turned on at a time $t_0$. At the same time as the apparatus is turned on, the reference current $I_{ref}$ flows from the reference current source 6 to the ground through the signal line 2a (the line resistance $R_w$), the resistor line (the resistance $R_x$) of the resistor sensor 1, the signal line 2c (the line resistance $R_w$) and the reference resistance $R_0$.

At the same time, the capacitors C1 to C3 are charged. After a predetermined charge period of time has elapsed, the following terminal voltages $E_1$ to $E_3$ of the capacitors C1 to C3 are obtained:

$$E_1=(R_w+R_w+R_0)\cdot I_{ref} \quad (2)$$

$$E_2=(R_w+R_0)\cdot I_{ref} \quad (3)$$

$$E_3=R_0\cdot I_{ref} \quad (4)$$

At a time $t_2$ when a sufficient period of time has elapsed since the time $t_1$, the switches S3 and SA are turned to the terminal (a) side.

As a result of this switching operation, the following voltages are applied to the positive and negative input terminals of the differential amplifier A2:

Input Voltage at (+) Terminal=$E_3$

Input Voltage at (−) Terminal=0

Therefore, if the differential amplifier A2 has a gain=1, an output voltage of the differential amplifier A2 is $E_3$ (=$R_0\cdot I_{ref}$). The output voltage ($E_3$) of the differential amplifier A2 is converted by the A/D converter 8 to a digital value, which is stored in the processor unit 9.

At a time $t_3$, as shown in FIG. 3, the switches S3 and SA are returned to the terminal (b) side and the switches S1 and S2 are turned to the terminal (a) side.

As a result of this switching operation, the following voltages are applied to the positive and negative input terminals of the differential amplifier A2:

Input Voltage at (+) Terminal=$E_1$

Input Voltage at (−) Terminal=2·$E_2$

Therefore, an output voltage (voltage across the input terminals) $E_{def}$ of the differential amplifier A2 is expressed as follows:

$$E_{def}=E_1-2\cdot E_2.$$

The output ($E_{def}$) of the differential amplifier A2 at this time is converted by the A/D converter 8 to a digital value, which is stored in the processor unit 9.

When the equations (2) and (3) are substituted for $E_1$ and $E_2$ in the above equation, $E_{def}$ is expressed as follows:

$$E_{def}(R_x+2\cdot R_w+R_0)\cdot I_{ref}-2\{(R_w+R_0)\cdot I_{ref}\}=(R_x-R_0)\cdot I_{ref}.$$

Assuming that the difference between $R_x$ and $R_0$ is $\Delta R$, $E_{def}$ can be represented as follows, since $R_x=R_0+\Delta R$:

$$E_{def}=\Delta R\cdot I_{ref}.$$

When the equation (4) is substituted for $I_{ref}$ of this equation and the resultant equation is transformed, the following equation (5) is obtained:

$$\Delta R=(E_{def}/E_3)\cdot R_0 \quad (5)$$

Since the value of the reference resistance $R_0$ is known, if the output voltages $E_3$ and $E_{def}$ of the differential amplifier A2 in the two states of the switches are obtained, the difference $\Delta R$ of the value of the resistance $R_x$ of the resistor sensor 1 from the value of the reference resistance $R_0$ can be detected. Thus, the value of the resistance $R_x$ of the resistor sensor 1 can be obtained from the difference $\Delta R$ by the following equation:

$$R_x=[1+(E_{def}/E_3)]\cdot R_0 \quad (6)$$

In the processor unit 9, the values of the voltages $E_3$ and $E_{def}$ obtained by the aforementioned two switching operations are substituted for $E_3$ and $E_{def}$ in the equation (6), so that the value of the resistance $R_x$ of the resistor sensor 1 is calculated.

In the resistor sensor input apparatus 5 as described above, the value of the resistance $R_x$ of the resistor sensor 1 can be detected with high accuracy, without an influence of the line resistances $R_w$ of the signal lines 2a to 2c.

In addition, as clear from the equation (6), the reference current $I_{ref}$ is not incorporated in the equation for obtaining the value of the resistance $R_x$ of the resistor sensor 1. Therefore, the reference current $I_{ref}$ output from the reference current source 6 need not be maintained precisely at a constant level for a long period of time. It is only necessary that the reference current should be constant between the time $t_1$, when a resistance detection starts, and the time $t_4$, when the detection ends.

Thus, the apparatus of this embodiment does not require two constant current circuits 4a and 4b, which output accurately constant currents $I_{ref1}$ and $I_{ref2}$, as required in the conventional resistor sensor input apparatus shown in FIG. 8. Hence, the cost of manufacturing the resistor sensor input apparatus as a whole can be greatly reduced.

Moreover, in the apparatus of this embodiment, since it is unnecessary to accurately adjust the constant currents $I_{ref1}$ and $I_{ref2}$ in advance to preset values, the operation efficiency can be greatly improved.

Figure 5:
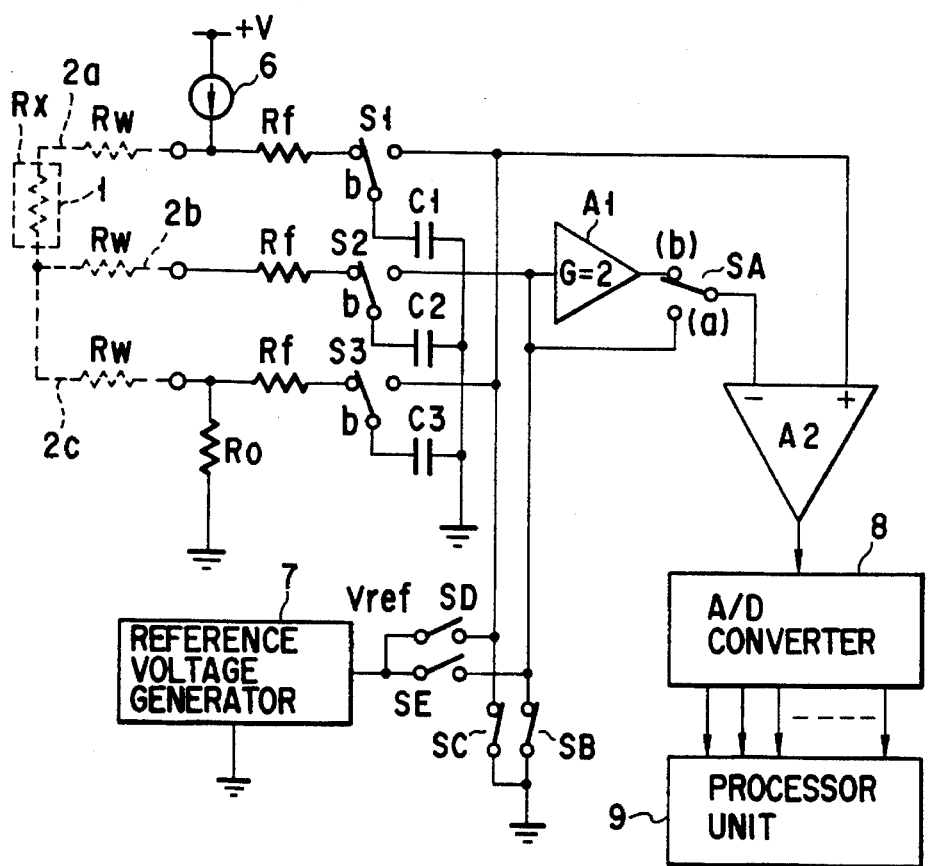
FIG. 5 is a circuit diagram showing a resistor sensor input apparatus according to a second embodiment of the present invention.

FIG. 5 is a circuit diagram showing a resistor sensor input apparatus according to a second embodiment of the present invention. The elements the same as those shown in FIG. 1 are identified with the same reference numerals used in FIG. 1.

In the apparatus of the second embodiment, a reference voltage generator 7 is connected between a positive terminal of a differential amplifier A2 and a terminal (a) of a switch SA via switches SD and SE. The terminal (a) of the switch SA and an input terminal of an amplifier A1 are short-circuited. The reference voltage generator 7 outputs a reference voltage $V_{ref}$ for calibration. The positive terminal of the differential amplifier A2 and the terminal (a) of the switch SA are connected in common to the ground via switches SC and SB. The switches SB, SC, SD and SE constitute a calibration switch circuit.

An analog output voltage from the differential amplifier A2 is converted by an A/D converter 8 to a parallel digital voltage, which is input to a processor unit 9.

A calibrating operation of the above resistor sensor input apparatus will be described.

(1) First, in a state where switches S1 to S3 are turned to a terminal (b) side, the switches SA is turned to a terminal (a) side, the switches SB and SC are closed and the switch SD and SE are opened. In this state, the input terminals of the differential amplifier A2 are short-circuited and an input voltage is 0 V. When the result is applied to the A/D converter 8, the A/D converter outputs a digital voltage corresponding to the input voltage 0 V. The result output from the A/D converter includes an offset error of the differential amplifier A2 and the A/D converter 8.

(2) Then, only the switch SA is turned to a terminal (b) side, with the result that the A/D converter 8 outputs a digital voltage including an offset error of the amplifier A1 in addition to the aforementioned offset error. The offset error of the differential amplifier A1 can be calculated by subtracting the offset error of the differential amplifier A2 and the A/D converter 8 from the digital voltage.

(3) Subsequently, the switch SA is turned to the terminal a side, the switches SB and SD are closed and the switches SC and SE are opened. In this case, the reference voltage $V_{ref}$ is input to the differential amplifier A2. As a result, the A/D converter 8 outputs a digital voltage including the offset error and the gain error of the differential amplifier A2 and the A/D converter 8 in addition to the theoretical value of the reference voltage $V_{ref}$.

(4) Then, the switch SA is turned to the terminal (b) side, the switches SB and SD are opened and the switches SC and SE are closed. As a result, the A/D converter 8 outputs a digital voltage including the offset error and the gain error of the amplifier A1 in addition to the aforementioned gain error.

By the above procedures (1) to (4), the offset error and the gain error of the differential amplifier A2 to the A/D converter 8 and the offset error and the gain error of the amplifier A1 can be obtained. Hence, the gain error of each circuit can be obtained by digital calculation of subtracting the known error due to the corresponding offset from the output voltage.

As described above, in the state of the switches as shown in FIG. 2, the aforementioned circuit error calibration is executed, after the reference current $I_{ref}$ from the reference current source 6 is detected. Subsequently, in the state of the switches as shown in FIG. 3, the processor unit 9 executes a calibration of circuit error including the error of the amplifier A1 and a calibration of the reference current, after the resistance value of the resistance $R_x$ of the resistor sensor 1 is detected. Through these calibrating operations, it is possible to compensate, by a digital calculation, the error of the analog circuit including the reference voltage $V_{ref}$, which can be set at a relatively high accuracy, and the reference current $I_{ref}$ excluding the reference resistance $R_0$. The compensation by using the error data is also useful for detecting malfunction of the circuit.

In the second embodiment, the reference voltage generator 7 and the switches SD and SE are provided in order to detect the gain error of the differential amplifier A2 and the like. However, the gain error can be detected, even if these elements are excluded. In this case, an amplifier, in which the offset and the gain are compensated, is used as the amplifier A1. The voltage output from the A/D converter 8 is proportional to the gain of the path between the signal lines 2a to 2c and the output terminal of the A/D converter 8. An ideal gain of the path can be calculated in advance from specification values of the circuit elements constituting the path. Therefore, if the ideal gain is prestored in the processor unit 9, a voltage value can be obtained from the output of the A/D converter 8 by causing the known reference current to flow through the resistor sensor 1. The gain error of the aforementioned path is obtained from the ratio of the voltage obtained by the actual detection to the ideal voltage value calculated from the known reference current and the ideal gain. The gain error is stored in the processor unit 9, and used as a calibration value, when an actual resistor value is measured.

FIG. 6 is a circuit diagram showing a resistor sensor input apparatus according to a third embodiment of the present invention.

The resistor sensor input apparatus of this embodiment incorporates a plurality of analog circuit boards 10, an amplifier A1, a differential amplifier A2 and a switch drive control unit 11.

Each of the analog circuit boards 10 is connected to a resistor sensor 1 via three signal lines 2a, 2b and 2c. The analog circuit board 10 incorporates a reference current source 6, a reference resistance $R_0$, three switches S1, S2 and S3 and three capacitors C1, C2 and C3, like the resistor input apparatus for the resistor sensor 1 as shown in FIG. 1. Terminals (a) of the switches S1 and S3 of the analog circuit boards 10 are connected in common to a positive input terminal of the differential amplifier A2. Terminals (a) of the switches S2 of the analog circuit boards 10 are connected in common to an input terminal of the amplifier A1.

Figure 4:
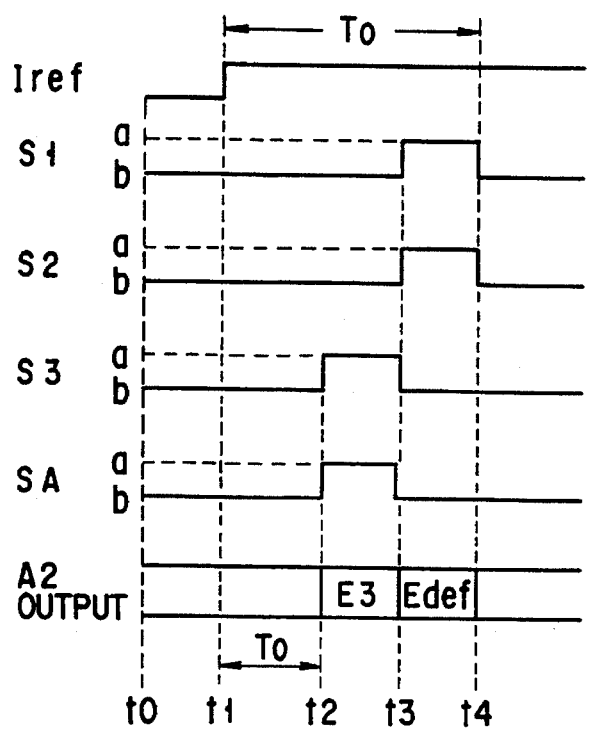
FIG. 4 is a timing chart showing operation procedures of the first embodiment.

The switch drive control unit 11 drives and controls the switches S1 to S3 incorporated in the analog circuit boards 10 and the switch SA in accordance with the operation procedures as shown in FIG. 4. In addition, it executes a unit switch control in a period $T_0$ between the start time $t_1$ and the end time $t_4$ shown in FIG. 4 for every analog circuit board in a time divisional manner in different time periods.

Thus, voltages $E_3$ and $E_{def}$ for calculating the resistance $R_x$ of each resistor sensor 1 are output to the differential amplifier A2 in every period $T_0$. Therefore, it is possible that, for example, the processor unit 9 as shown in FIG. 5 successively calculates the resistance $R_x$ of the resistor sensors 1 in the constant period $T_0$. Even in the above structure, only one reference current source suffices for each resistor sensor and the resistances of the respective resistor sensors can be detected with high accuracy, as in the embodiment shown in FIG. 1.

Figure 7:
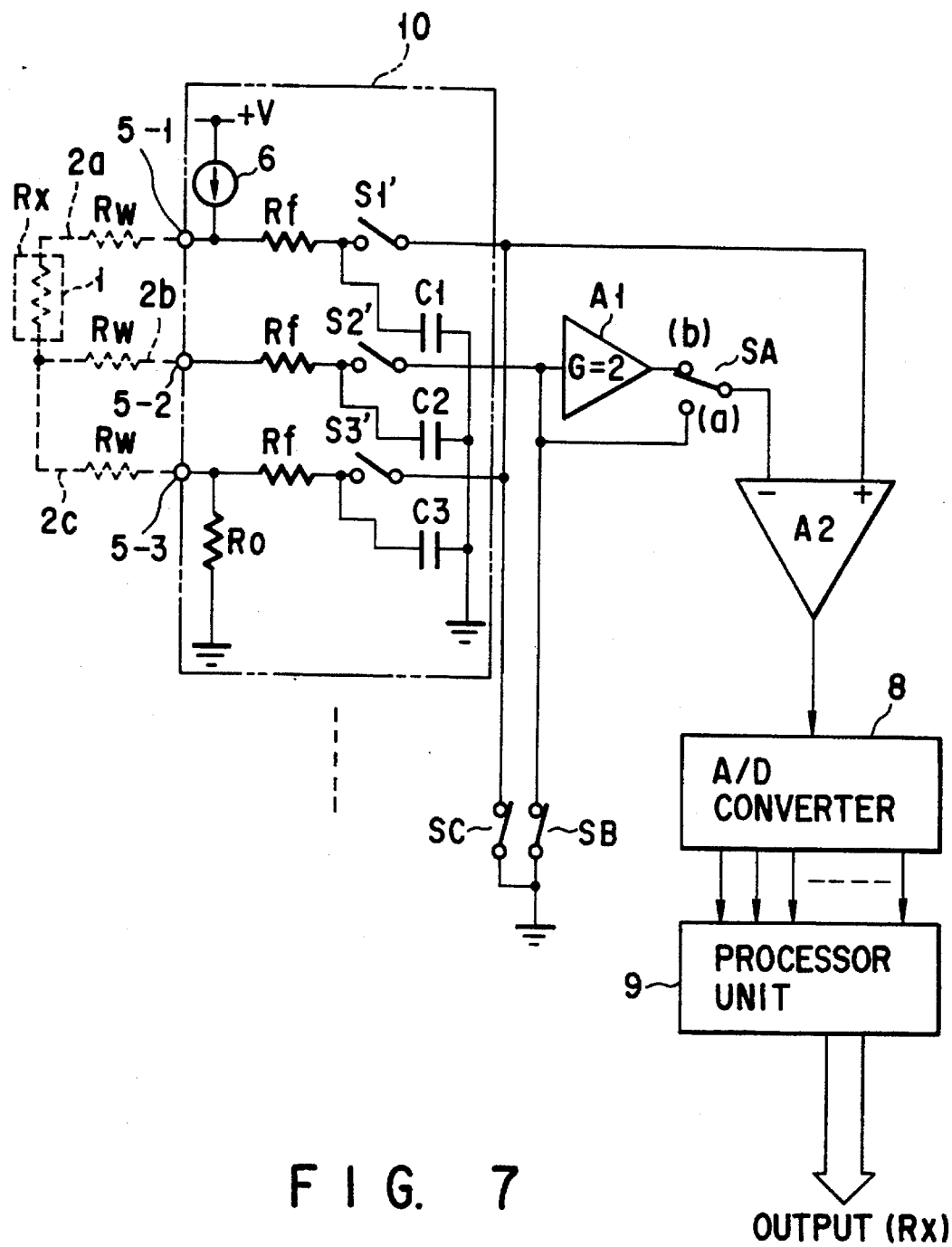
FIG. 7 is a circuit diagram showing a resistor sensor input apparatus according to a fourth embodiment of the present invention.

FIG. 7 is a circuit diagram showing a resistor sensor input apparatus according to a fourth embodiment of the present invention.

In the apparatus of this embodiment, a first contact terminal 5-1, connected to a first signal line 2a, is connected to a positive input terminal of a differential amplifier A2 via a switch S1'. A second contact terminal 5-2, connected to a second signal line 2b, is connected to an input terminal of an amplifier A1 via a switch S2'. A third contact terminal 5-3, connected to a third signal line 2c, is connected to the positive input terminal of the differential amplifier A2. First ends of capacitors C1 to C3 are grounded and second ends thereof are directly connected to contact terminals of the respective signal lines. In other words, the capacitors C1 to C3 are always connected to the signal lines 2a to 2c, respectively.

The input terminals of the differential amplifier A2 can be short-circuited, depending on combination of switches SA to SC, which are controlled by a switch drive control unit (not shown). An offset error of the differential amplifier A2 and the A/D converter 8 and a gain error of the path from the signal lines 2a, 2b and 2c to the processor unit 9 are obtained from the ideal gain and the reference current in the manner as described above.

As has been described above, with the resistor sensor input apparatus of the present invention, the number of the reference current source required for one resistor sensor is decreased to one, while the high accuracy in detection of the resistance value is maintained. In addition, the reference current flowing through the resistor sensor need not be detected. Moreover, the circuit structure of the input apparatus can be simplified and the operability thereof can be greatly improved.

Furthermore, since the reference voltage and the calibration voltage of 0 V can be applied to the differential amplifier, it is possible to correct variance factors such as temperature drift by correcting an error in the analog circuit. The calibration can be applicable to detection of a malfunction of the circuit.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An apparatus for detecting a resistance value of a resistor sensor to which a reference current is supplied, and inputting a detected resistance to an external device said apparatus comprising:

a first signal line connecting a first end of the resistor sensor and a first contact terminal provided in the apparatus;

a second signal line connecting a second end of the resistor sensor and a second contact terminal provided in the apparatus;

a third signal line connecting the second end of the resistor sensor and a third contact terminal provided in the apparatus;

a reference resistance element having a first end connected to the third contact terminal and a second end connected to a ground;

a reference current source for supplying the reference current to the first signal line through the first contact terminal;

a first voltage holding means for holding a voltage $E_1$ across the first signal line and the ground;

a second voltage holding means for holding a voltage $E_2$ across the second signal line and the ground;

a third voltage holding means for holding a voltage $E_3$ across the first and second ends of the reference resistance element;

a differential amplifier, having first and second input terminals, for detecting the voltage $E_3$ held by the third voltage holding means and detecting a differential voltage $E_{def}$ corresponding to a difference between the voltage $E_1$ held by the first voltage holding means and a voltage $E_2$ held by the second voltage holding means, obtained by amplifying the voltage $E_2$ with a gain corresponding to resistance of the first and second signal lines; and switching means, inserted between the differential amplifier and the first to third voltage holding means, for connecting the third voltage holding means to the first input terminal of the differential amplifier, when the voltage $E_3$ is detected by the differential amplifier, and respectively connecting the first and second voltage holding means to the first and second input terminals of the differential amplifier, when the voltage $E_{def}$ is detected by the differential amplifier.

2. The apparatus according to claim 1, wherein the first to third voltage holding means are respectively comprised of first to third capacitors, each having a first end connected to the ground and a second end connected to one of the first to third contact terminals, and the switching means is comprised of a first switch for applying a voltage charged in the first capacitor to the first input terminal of the differential amplifier; a second switch for applying a voltage charged in the second capacitor to the second input terminal of the differential amplifier; a third switch for applying a voltage charged in the third capacitor to the first input terminal of the differential amplifier; and a fourth switch for selectively connecting the second input terminal of the differential amplifier to the second switch or the ground, so as to connect the second input terminal of the differential amplifier to the ground, when the voltage charged in the third capacitor is applied to the first input terminal of the differential amplifier, and connect the second switch to the second input terminal of the differential amplifier, when the voltage charged in the second capacitor is applied to the second input terminal of the differential amplifier.

3. The apparatus according to claim 2, further comprising:

fifth switch for selectively connecting the first input terminal of the differential amplifier to the ground;

controlling means for controlling the fourth and fifth switches so that the first and second input terminals of the differential amplifier are short-circuited, when an offset error of the differential amplifier is corrected; and entrapping means for entrapping an output signal from the differential amplifier when the first and second input terminals of the differential amplifier are short-circuited and measuring the offset error based on the entrapped output signal.

4. The apparatus according to claim 2, further comprising:

a reference voltage source for generating a reference voltage;

a fifth switch for selectively connecting the first input terminal of the differential amplifier to the ground; and calibrating means for applying the reference voltage generated by the reference voltage source to the first and second input terminals of the differential amplifier to correct a gain error and short-circuiting the first and second input terminals of the differential amplifier to correct an offset error of the differential amplifier.

5. The apparatus according to claim 1, wherein the first to third voltage holding means are respectively comprised of first to third capacitors, each having a first end connected to the ground, and the switching means is comprised of a first switch for charging the first capacitor in accordance with a voltage of the first signal line and applying a voltage charged in the first capacitor to the first input terminal of the differential amplifier; a second switch for charging the second capacitor in accordance with a voltage of the second signal line and applying a voltage charged in the second capacitor to the second input terminal of the differential amplifier; a third switch for charging the third capacitor in accordance with a voltage of the third signal line and applying a voltage charged in the third capacitor to the first input terminal of the differential amplifier; and a fourth switch for selectively connecting the second input terminal of the differential amplifier to the second switch or the ground, so as to connect the second input terminal of the differential amplifier to the ground, when the voltage charged in the third capacitor is applied to the first input terminal of the differential amplifier, and connect the second switch to the second input terminal of the differential amplifier, when the voltage charged in the second capacitor is applied to the second input terminal of the differential amplifier.

6. The apparatus according to claim 5, further comprising:

a fifth switch for selectively connecting the first input terminal of the differential amplifier to the ground;

controlling means for controlling the fourth and fifth switches so that the first and second input terminals of the differential amplifier are short-circuited, when an offset error of the differential amplifier is corrected; and entrapping means for entrapping an output signal from the differential amplifier when the first and second input terminals of the differential amplifier is short-circuited and measuring the offset error based on the fetched output signal.

7. The apparatus according to claim 5, further comprising:

a reference voltage source for generating a reference voltage;

a fifth switch for selectively connecting the first input terminal of the differential amplifier to the ground; and calibrating means for applying the reference voltage generated by the reference voltage source to the first and second input terminals of the differential amplifier to correct a gain error and short-circuiting the first and second input terminals of the differential amplifier to correct an offset error of the differential amplifier.

8. The apparatus according to claim 7, wherein the calibrating means comprises:

the fifth switch for selectively connecting the first input terminal of the differential amplifier to the ground;

a sixth switch for selectively connecting the reference voltage source to the first input terminal of the differential amplifier;

a seventh switch for selectively connecting the reference voltage source to the second input terminal of the differential amplifier via the fourth switch; and controlling means for controlling the fourth to seventh switches so that the first and second terminals of the differential amplifier are short-circuited to correct the offset error of the differential amplifier.

9. The apparatus according to claim 1, further comprising a processor unit for calculating a resistance $R_x$ of the resistor sensor from the voltage $E_3$ and the differential voltage $E_{def}$ detected by the differential amplifier and a resistance value $R_0$ of the reference resistance element which has been input in advance to the processor unit, based on the following equation:

$$R_x = [1 + (E_{def}/E_3)] \cdot E_0.$$

10. The apparatus according to claim 1, further comprising:

calibrating means for short-circuiting the first and second input terminals of the differential amplifier to correct an offset error of the differential amplifier;

means for entrapping an output signal from the differential amplifier when the first and second input terminals of the differential amplifier are short-circuited by the calibrating means and measuring the offset error based on the entrapped output signal.

11. The apparatus according to claim 1, further comprising:

a reference voltage source for generating a reference voltage; and calibrating means for applying the reference voltage generated by the reference voltage source to the first and second input terminals of the differential amplifier to correct a gain error and short-circuiting the first and second input terminals of the differential amplifier to correct an offset error of the differential amplifier.

12. An apparatus for causing a reference current to flow through a plurality of resistor sensors and measuring resistance values of the respective resistor sensors, said apparatus comprising:

a plurality of measuring units respectively corresponding to the resistor sensors;

a plurality of first signal lines, each connecting a first end of each of the resistor sensors and a first contact terminal of each of the measuring units;

a plurality of second signal lines, each connecting a second end of each of the resistor sensors and a second contact terminal of each of the measuring units;

a plurality of third signal lines, each connecting the second end of each of the resistor sensors and a third contact terminal of each of the measuring units;

a plurality of reference resistance elements, provided in the respective measuring units, each having a first end connected to the third contact terminal of a corresponding measuring unit and a second end connected to the ground;

a plurality of reference current sources, provided in the respective measuring units, for supplying the reference current to the first signal lines through the first contact terminals;

a plurality of first voltage holding means, provided in the respective measuring units, for holding a voltage $E_1$ across the respective first signal lines and the ground;

a plurality of second voltage holding means, provided in the respective measuring units, for holding a voltage $E_2$ across the respective second signal lines and the ground;

a plurality of third voltage holding means, provided in the respective measuring units, for holding a voltage $E_3$ across the first and second ends of the respective reference resistance elements;

a differential amplifier, having first and second input terminals, for detecting the voltage $E_3$ held by each of the third voltage holding means and detecting a differential voltage $E_{def}$ corresponding to a difference between the voltage $E_1$ held by the first voltage holding means and a voltage $E_2$ held by the second voltage holding means, with a gain corresponding to resistance values of the first and second signal lines;

switching means, provided for the respective measuring units and inserted between the differential amplifier and the first to third voltage holding means of the respective measuring units, for connecting the third voltage holding means to the first input terminal of the differential amplifier, when the voltage $E_3$ is detected by the differential amplifier, and respectively connecting the first and second voltage holding means to the first and second input terminals of the differential amplifier, when the voltage $E_{def}$ is detected by the differential amplifier; and time-divisional driving means for driving the switching means of the respective measuring units in a time divisional manner, so that the voltage $E_3$ and the differential voltage $E_{def}$ of every measuring unit are detected by the differential amplifier.

13. The apparatus according to claim 12, wherein the first to third voltage holding means are respectively comprised of first to third capacitors, each having a first end connected to the ground and a second end connected to one of the first to third contact terminals, and each of the switching means is comprised of a first switch for applying a voltage charged in the first capacitor to the first input terminal of the differential amplifier; a second switch for applying a voltage charged in the second capacitor to the second input terminal of the differential amplifier; a third switch for applying a voltage charged in the third capacitor to the first input terminal of the differential amplifier; and a fourth switch for selectively connecting the second input terminal of the differential amplifier to the second switch or the ground, so as to connect the second input terminal of the differential amplifier to the ground, when the voltage charged in the third capacitor is applied to the first input terminal of the differential amplifier, and connect the second switch to the second input terminal of the differential amplifier, when the voltage charged in the second capacitor is applied to the second input terminal of the differential amplifier.

14. The apparatus according to claim 12, wherein the first to third voltage holding means are respectively comprised of first to third capacitors, each having a first end connected to the ground, and each of the switching means is comprised of a first switch for charging the first capacitor in accordance with a voltage of the first signal line and applying a voltage charged in the first capacitor to the first input terminal of the differential amplifier; a second switch for charging the second capacitor in accordance with a voltage of the second signal line and applying a voltage charged in the second capacitor to the second input terminal of the differential amplifier; a third switch for charging the third capacitor in accordance with a voltage of the third signal line and applying a voltage charged in the third capacitor to the first input terminal of the differential amplifier; and a fourth switch for selectively connecting the second input terminal of the differential amplifier to the second switch or the ground, so as to connect the second input terminal of the differential amplifier to the ground, when the voltage charged in the third capacitor is applied to the first input terminal of the differential amplifier, and connect the second switch to the second input terminal of the differential amplifier, when the voltage charged in the second capacitor is applied to the second input terminal of the differential amplifier.

15. The apparatus according to claim 12, further comprising a processor unit for calculating a resistance value $R_x$ of each of the resistor sensors from the voltage $E_3$ and the differential voltage $E_{def}$ detected by the differential amplifier and a resistance value $R_0$ of the reference resistance element which has been input in advance to the processor unit, based on the following equation:

$$R_x = [1 + (E_{def}/E_3)] \cdot R_0.$$

16. The apparatus according to claim 12, further comprising:

calibrating means for short-circuiting the first and second input terminals of the differential amplifier to correct an offset error of the differential amplifier;

entrapping means for entrapping an output signal from the differential amplifier when the first and second input terminals of the differential amplifier are short-circuited by the calibrating means and measuring the offset error based on the fetched output signal.

17. The apparatus according to claim 12, further comprising:

a reference voltage source for generating a reference voltage; and calibrating means for applying the reference voltage generated by the reference voltage source to the first and second input terminals of the differential amplifier to correct a gain error and short-circuiting the first and second input terminals of the differential amplifier to correct an offset error of the differential amplifier.

* * * * *